US005920240A

United States Patent [19]

Alexanian et al.

[11] Patent Number: 5,920,240

[45] Date of Patent: Jul. 6, 1999

[54] HIGH EFFICIENCY BROADBAND COAXIAL POWER COMBINER/SPLITTER WITH RADIAL SLOTLINE CARDS

[75] Inventors: Angelos Alexanian, Goleta; Robert A. York, Santa Barbara, both of Calif.

[73] Assignee: The Regents of the University of California, Oakland, Calif.

[21] Appl. No.: 08/873,069

[22] Filed: Jun. 11, 1997

Related U.S. Application Data

[63] Continuation-in-part of application No. 08/666,803, Jun. 19, 1996, Pat. No. 5,736,908.

[51] Int. Cl.[6] ................................ H01P 5/12; H03F 3/60

[52] U.S. Cl. .......................... 333/127; 333/136; 330/286; 330/295

[58] Field of Search .................................... 333/125, 127, 333/128, 136; 330/286, 295

[56] References Cited

U.S. PATENT DOCUMENTS

| | | | |
|---|---|---|---|
| 4,163,955 | 8/1979 | Iden et al. | 333/127 |
| 4,234,854 | 11/1980 | Schellenberg et al. | 330/286 |
| 4,272,740 | 6/1981 | MacMaster et al. | 333/127 |
| 4,283,685 | 8/1981 | MacMaster et al. | 330/286 |
| 4,291,278 | 9/1981 | Quine | 330/286 |
| 4,371,845 | 2/1983 | Pitzalis, Jr. | 330/286 X |
| 4,588,962 | 5/1986 | Saito et al. | 330/295 X |
| 4,700,145 | 10/1987 | Yelland et al. | 330/286 |
| 4,728,904 | 3/1988 | Swift et al. | 330/286 |
| 4,789,840 | 12/1988 | Albin | 333/247 |
| 4,835,496 | 5/1989 | Schellenberg et al. | 333/128 |
| 4,931,747 | 6/1990 | Hom | 330/286 |
| 4,956,614 | 9/1990 | Baril | 330/286 |
| 5,142,253 | 8/1992 | Mallavarpu et al. | 333/127 |
| 5,214,394 | 5/1993 | Wong | 330/286 |
| 5,225,797 | 7/1993 | Schary et al. | 333/125 |
| 5,256,988 | 10/1993 | Izadian | 330/295 |

FOREIGN PATENT DOCUMENTS

| | | | |
|---|---|---|---|
| 59-4211 | 1/1984 | Japan | 330/295 |

*Primary Examiner*—Robert Pascal
*Assistant Examiner*—Justin P. Bettendorf
*Attorney, Agent, or Firm*—Daniel L. Dawes

[57] ABSTRACT

A high-powered, solid state microwave and millimeter wave, power combiner and divider is provided by using a plurality of radially oriented tapered slotline cards disposed in a center cylindrical coaxial section between its inner and outer conductors. The cylindrical coaxial section in turn is coupled to a conical input coaxial section that couples and distributes the input signal among the plurality of cards, and an output coaxial section that combines the output signal from the plurality of cards to an output coaxial terminal. The device is compact with broadband performance and provides a natural heat sink for a plurality of lower powered devices, which enables the power combiner to use a large number of lower powered devices to meet larger power requirements.

17 Claims, 2 Drawing Sheets

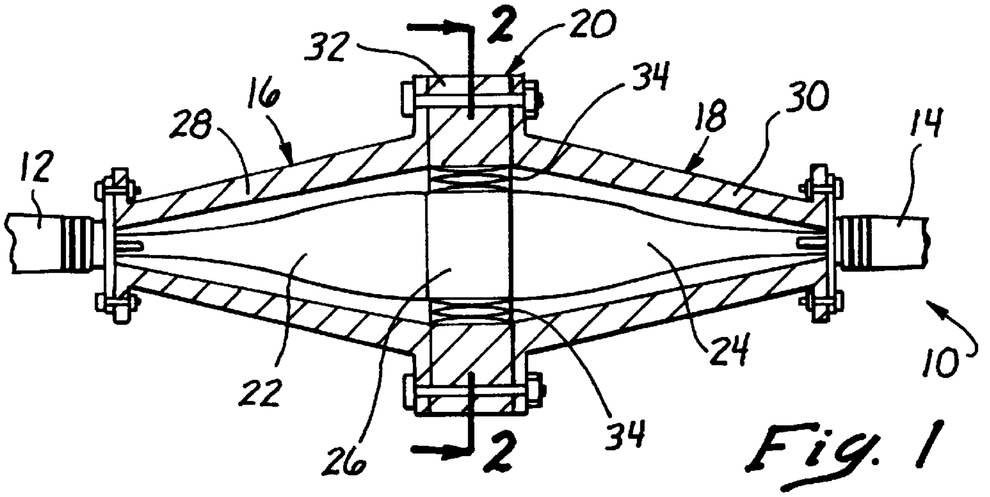
Fig. 1
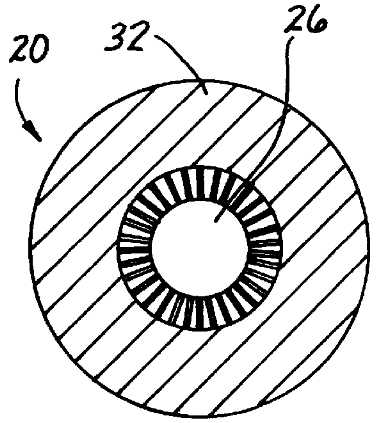
Fig. 2
Fig. 5
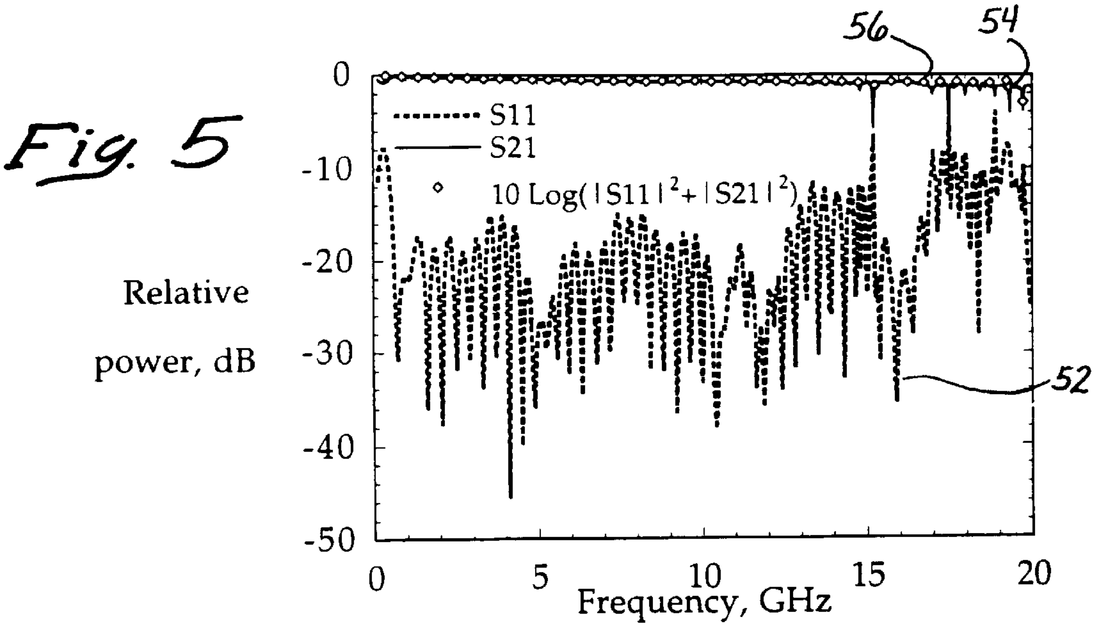

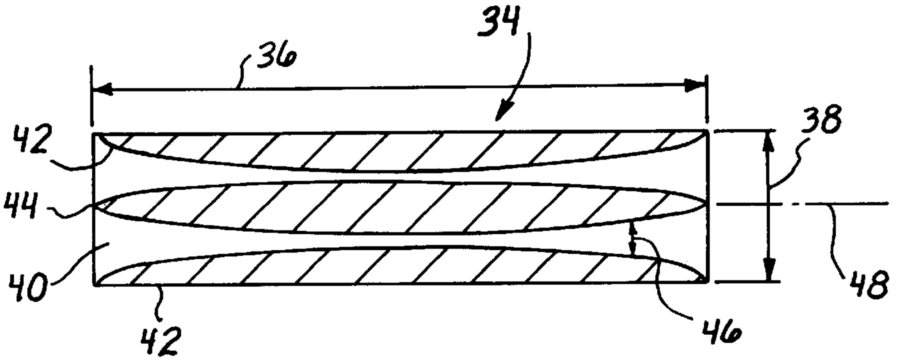
Fig. 3
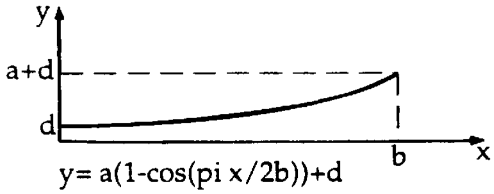
Fig. 3a
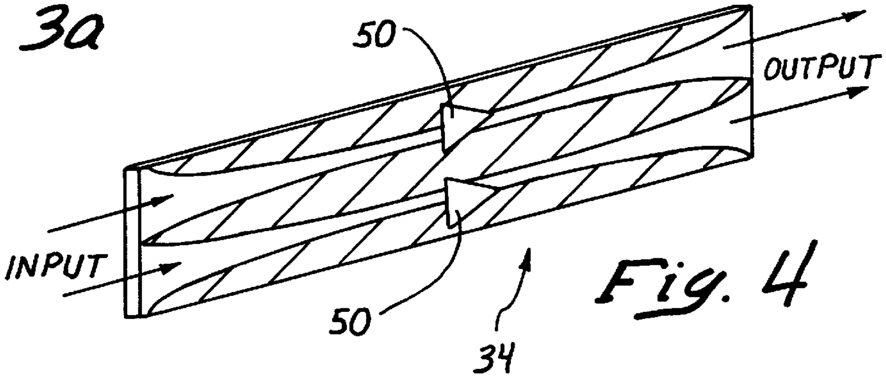
Fig. 4
Fig. 6
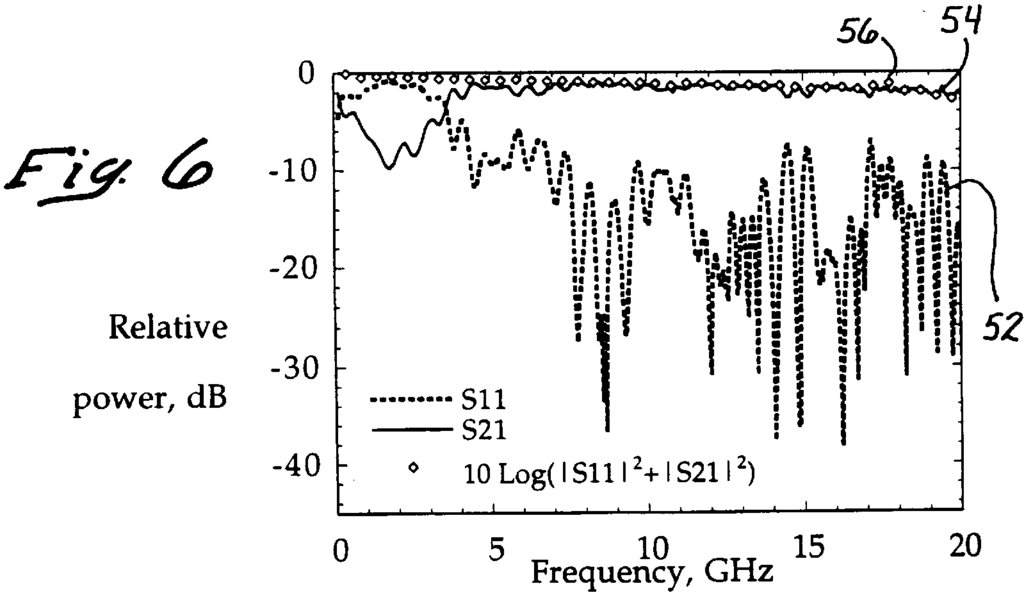

HIGH EFFICIENCY BROADBAND COAXIAL POWER COMBINER/SPLITTER WITH RADIAL SLOTLINE CARDS

The present application is a continuation in part of U.S. patent application Ser. No. 08/666,803, now U.S. Pat. No. 5,736,908 entitled A WAVEGUIDE-BASED SPATIAL POWER COMBING ARRAY AND METHOD FOR USING THE SAME, assigned to the same assignee of the present invention, filed Jun. 19, 1996, and incorporated herein by reference.

BACKGROUND OF THE INVENTION

1. Field of the Invention

The invention relates to a method for dividing and combining electromagnetic energy in a coaxial device. In particular, the invention relates to a radial power combiner using flared coaxial lines in combination with broadband tapered slot transitions.

2. Description of the Prior Art

Quine, "*Planar Microwave Integrated Circuit Power Combiner,*" U.S. Pat. No. 4,291,278 (1981), applied to General Electric Company, shows a power splitter and combiner in FIGS. 1, 2, 4, 6 and 8 comprised of a conventional rectangular waveguide 11 used to launch a wave into a taper section 12. An array of waveguide-microstrip finlined transitions 13 having tapered slot transitions divides the microwave power equally among two or more microstrip lines. These microstrip lines in turn feed a multistage FET amplifier 15 fabricated in microwave IC form. The array of microstrip-waveguide fin-line transitions 16 therefore combines the power from a plurality of microstrip lines. The fin-line array 13 and 16 as shown in FIG. 1 may be identical to one another with the exception that they face in opposite directions.

Izadian, "*Conical Transverse Electromagnetic Divider/Combiner,*" U.S. Pat. No. 5,256,988 (1993), assigned to Loral Aerospace Corporation, shows in FIGS. 1, 2, 4 and 6 a TEM divider/combiner 10 comprised of an input port 12 feeding a circular waveguide 14. A tapered or conical coaxial device 16 is coupled to circular waveguide 14 and includes a plurality of amplifiers 18 depicted in FIGS. 3 and 4. A second circular tapered waveguide 22 is coupled to an output port 24. As shown in FIG. 2, coaxial device 16 divides a signal using a conical dividing waveguide 42, 32, a first parallel plate waveguide 40, 50 and then a plurality of flared strip lines 54 depicted in FIG. 3. Strip lines 54 couple first parallel plate waveguide 40, 50 to the inputs of the plurality of amplifiers 18. Amplifiers 18 each amplify one of the divided signals and output the results to a second parallel plate waveguide 40, 52. The signals from amplifiers 18 are recombined by this waveguide in the conical combining waveguide. FIG. 6 shows strip line 54 as preferably comprised of a continuous taper for impedance matching between cylindrical coaxial TEM and amplifier 18. Strip lines 54 have similar shapes at each end of the splitter/combiner, however, at each end of the combiner, the strip lines have an opposite orientation.

MacMaster, et al., "*Coaxial-to-Cylindrical Array Transition,*" U.S. Pat. No. 4,272,740 (1981), assigned to Raytheon Company, describes in connection with FIG. 1 a power amplifier having a plurality of amplifying elements 62 disposed in a set of transmission lines 64. Transmission lines 64 are in a unitary structure at cage 66 whereby energy is coupled via a single input terminal 68 and output through a single output terminal 70. The distribution of power among transmission lines 64 is accomplished by power splitter 72. Power from transmission lines 64 is combined by means of power combiner 74. FIGS. 4–21 show a series of stepped and/or tapered transitions in the walls of the transmission lines 64 for the case where the input terminal 68 is coaxial. FIGS. 23–29 show waveguide assemblies 150 coupled via circular waveguides 152 to conical waveguides 154. Conical waveguides 154 are coupled via phase shift assemblies 156 to transition sections 158 which in turn are coupled to cage 66.

Saito, et al., "*Device for Distributing and Combining Microwave Electric Power,*" U.S. Pat. No. 4,588,962 (1986), assigned to Fijitsu Limited, describes in connection with FIG. 13 a splitter in which waves travel in direction A through a rectangular waveguide 31 and are coupled into a plurality of microstrips 133 at their tapered connection regions. Amplifiers are connected to a plurality of microstrip lines 133. As a combiner, the electromagnetic wave travels in direction B and is coupled from the plurality of microstrip lines 33 into rectangular waveguide 131. FIG. 5B shows a flared microstrip line referred to as an antenna. Saito also refers to FIGS. 1 and 2 of Albin, "*Integrated Capacitance Structures in Microwave Finline Devices,*" U.S. Pat. No. 4,789,840 (1988) assigned to Hewlett-Packard Company, and to Swift, et al., "*Extra High Frequency (EHF) Circuit Module,*" U.S. Pat. No. 4,728,904 (1988) assigned to TRW Inc.

Pitzalis, Jr., "*Modular Microwave Power Divider-Amplifier-Combiner,*" U.S. Pat. No. 4,371,845 (1983) assigned to Hughes Aircraft Company, refers to FIG. 1 to a device 10 comprised of a divider 20, plural amplifier modules 15 and combiner 25. A plurality of radially extending microstrip conductors extend to the edge of divider circuit 20 at point 30 and come into contact with conductor 35 of amplifier module 15. Each of amplifier modules 15 is connected to divider 20 and combiner 25 in a similar manner. Coaxial transmission lines 120 carry the wave into and out of device 10. Pitzalis is broadly relevant for showing a radial arrangement of a power splitter and combiner.

What is needed is an RF power combiner which is compact and can be used for high power applications using low power components.

BRIEF SUMMARY OF THE INVENTION

The invention is a microwave power combiner comprising a conical coaxial first section, a conical coaxial second section, and a center cylindrical coaxial section coupled between the first and second conical coaxial sections. A plurality of tapered slotline cards are radially disposed in the center cylindrical coaxial section between an inner and outer conductor thereof and electromagnetically coupled to the first and second conical coaxial sections. A corresponding plurality of devices disposed on each of the plurality of tapered slotline cards wherein power coupled to a first one of the first and second conical sections is efficiently distributed among the plurality of devices and then efficiently recombined in a second one first and second conical sections so that a compact array with an increased number of the devices is provided in the combiner. The plurality of devices may be either passive or active circuits.

At least two tapered slotline structures are provided on each of the tapered slotline cards. The plurality of devices in one embodiment comprise amplifiers for amplifying a received input signal on one of the first and second conical sections and outputting the amplified signal on a second one of the first and second conical sections. The signal communication through the combiner is bidirectional, being either received by the first conical section and output through the second conical section and vice versa.

In the illustrated embodiment each tapered slotline card is comprised of a substrate with at least two slotlines structures defined thereon. One of the plurality of devices is electrically coupled to each of the slotlines structures on each of the substrates. The substrate is arranged between the inner and outer conductors of the center cylindrical coaxial section and lies on a radial plane defined through the center cylindrical coaxial section. Each of the plurality of taper slotline cards is positioned radially within the center cylindrical coaxial section at approximately 11.25° increments. The angular increment will of course vary as the number of cards is varied, which in turn will be variable depending on the radius of the combiner and the size of the cards. In the illustrated embodiment at least 32 of the tapered slotline cards are disposed in the center cylindrical coaxial section. This number clearly can be increased or decreased according to the power requirements and sizes available.

Each of the tapered slotline cards are arranged and configured to provide a gradual transition from a coaxial transmission line within the first and second conical sections to a planar transmission line within the tapered slotline card.

The tapered slotline card comprises at least one tapered slot structure disposed on the card arranged and configured to minimize reflection and/or to optimize impedance matching between the center cylindrical coaxial section and the first and second conical coaxial sections. The plurality of slotline cards are provided in the combiner in a number dependent upon power output demanded for the combiner.

The invention is also characterized as a method of efficiently combining high-powered electromagnetic signals comprising the steps of providing an input electromagnetic signal to a first flared coaxial section and distributing the electromagnetic signal in the first flared coaxial section to and in a center cylindrical coaxial section. The electromagnetic signal is coupled to and distributed among a plurality of radially oriented tapered slotline structures disposed between an inner conductor of the cylindrical coaxial section and an outer conductor of the cylindrical coaxial section. The electromagnetic signal in each of the tapered slotline cards is processed in some manner within a corresponding device, typically amplified. The electromagnetic signal output by the device from each of the plurality of tapered slotline cards is combined into a second flared coaxial section. High-powered electromagnetic signals are thus operated upon by plurality of lower powered devices in a compact assembly to result in a efficient and broadband operation.

The invention may now be better visualized by turning to the following drawings wherein liked elements are referenced by liked numerals.

BRIEF DESCRIPTION OF THE DRAWINGS

FIG. 1 is a longitudinal cross-sectional side view for broad brand coaxial transferred electromagnetic wave combiner according to the invention.

FIG. 2 is a perpendicular cross-sectional view of the coaxial combiner of FIG. 1 as seen through section lines 2–3 of FIG. 1.

FIG. 3 is a side elevational view of one of the printed slot line taper card utilized in FIGS. 1 and 2 shown in the absence of a device.

FIG. 3*a* is a graph of the curve used to form the tapered metalizations of the slotline card of FIG. 3.

FIG. 4 is a perspective view of the slotline taper card utilized in FIGS. 1–3 in which a device is symbolically shown included on the card.

FIG. 5 is a graph showing the relative power, dB in the vertical scale against frequencies in GHz for a coaxial combiner of the type shown in FIG. 1, but without any slotline cards installed.

FIG. 6 is a graph of the relative power in dB drafted against frequency in GHz of the coaxial combiner of FIGS. 1–4 with the 32 slotline cards installed, but without any devices mounted thereon.

The invention and its various embodiments may now be better understood by turning to the following detailed description of the preferred embodiments.

DETAILED DESCRIPTION OF THE PREFERRED EMBODIMENTS

A high-powered, solid state microwave and millimeter wave, power combiner and divider is provided by using a plurality of radially oriented tapered slotline cards disposed in a center cylindrical coaxial section between its inner and outer conductors. The cylindrical coaxial section in turn is coupled to a conical input coaxial section that couples and distributes the input signal among the plurality of cards, and an output coaxial section that combines the output signal from the plurality of cards to an output coaxial terminal. The device is compact with broadband performance and provides a natural heat sink for a plurality of lower powered devices, which enables the power combiner to use a large number of lower powered devices to meet larger power requirements.

High-powered components at the microwave and millimeter wave frequencies require efficient power combining techniques. The longitudinal cross-sectional view of FIG. 1 shows a radial power combiner, generally denoted by reference numeral 10, based on a flared coaxial line. Combiner 10 incorporates high efficiency spatial combining with broadband tapered slot transitions described below in greater detail in connection with FIGS. 3 and 4. This approach has broadband performance and compactness. It provides for a natural heatsink for any devices mounted on the slotline cards, such as discussed in connection with the embodiment of FIG. 4, and accommodates a larger number of such devices. By adjusting the radii of the coaxial line shown in FIGS. 1 and 2, the number of active elements can be increased to meet any power requirements.

Turning specifically to FIG. 1, conventional coaxial terminals 12 and 14 are coupled to each end of combiner 10. Each end of combiner 10 then is flared from the corresponding coaxial coupling 12 or 14 into a conical coaxial flared section 16 or 18, respectively. Flared sections 16 and 18 meet in the center of combiner 10 in a center cylindrical coaxial section 20. The sections are shown as bolted together, but any manner now known or later devised for their physical and electrical coupling may be employed. Each flared coaxial section 16 and 18 has a corresponding inner conductor 22 and 24, respectively, which is similarly flared to physically and electrically couple to a center coaxial inner conductor 26. An outer conical shell 28 and 30, respectively, form the opposing coaxial conductor for flared sections 16 and 18, respectively. Similarly, the center inner coaxial conductor 26 is opposed to an outer cylindrical coaxial conductor 32, which together form cylindrical coaxial section 20.

A plurality of slotline transition cards, each generally denoted by reference numeral 34, are then radially disposed between the gap between outer conductor 32 and inner conductor 26 of center coaxial section 20. Slotline transitions 34 are positioned and adapted to receive and transmit electromagnetic energy by directionally through combiner 10 to and from flared sections 16 and 18. Thus, flared coaxial lines 16 and 18 are loaded radially with tapered slotlines 34, along the direction of wave propagation. Each input slotline 34 provides a gradual transition from the coaxial transfer magnetic field (TEM) to a planar transmission line 34 described in greater detail below in connection with FIGS. 3 and 4. By this means compatibility with standard microwave integrated circuitry which is or can be mounted on slotlines 34 is provided.

After passing through an active or passive microwave circuit on slotline cards 34, the signal is coupled back in to the coaxial line, using a similar tapered slotline on cards 34. The size of each of the elements, such as the diameters and length of tapers, is chosen to minimize reflections and optimize impedance matching and broadband performance.

FIG. 2 is a perpendicular cross-section as seen through lines 2–2 of FIG. 1 and illustrate the relationship between outer conductor 32, inner conductor 26 of coaxial section 20 and a plurality of transition cards 34, which are radially disposed between conductors 26 and 32. In the illustrated embodiment, a slotline card 34 is provided at azimuthal increments of 11.25° around conductor 26 of center section 20 of combiner 10. Again the angular increment is arbitrary and may be varied according to the number of cards 34 inserted into combiner 10. The larger the radius of combiner 10 the greater the number of cards 34 may be inserted given a fixed size of card 34. Within reasonable design choice, there is no criticality to the angular increment chosen for placement of cards 34.

Turn to FIG. 3, wherein slot line transition cards 34 is depicted in side elevation view. The slotline cards described herein are identical to those described and shown in the above denoted parent application. Therefore, cards 34 should be understood in the context of the incorporated reference, but will be redescribed in part here for the purposes of ease of description. In the illustrated embodiment, length 36 is 1.77 inches while 38 is 0.4 inches. Metalizations forming the slotlines are formed on one side of an insulating substrate 40. The metalizations include a top and bottom symmetrical metalization 42 and a center metalization 44 between them. The slotlines 46 defined by the spacing between metalizations 42 and 44 are symmetrical about the horizontal mid-axis 48 of card 34. The tapered profile of metalizations 42 and 44 is illustrated diagrammatically in FIG. 3*a* as given by the equation $y=a(1-\cos(\pi x/2b))+d$, where a is the halfwidth thickness of the metalization, d the minimum distance between metalizations and b the half distance of length of the metalization.

In the illustrated embodiment, the two element vertical array as shown in FIGS. 3 and 4 has been chosen although as previously stated, any number of elements may be used. Aluminum nitride has been used for substrate 40 due to its superior heat sinking properties, but other materials may be selected depending on the application. The length of the array of slotline 34 is 2(*b*), chosen so that the impedance of taper from the broad part of slotline 34 to its narrowest part is gradual enough to minimize reflections. This favors a long structure which must be balanced against size constraints. The slot impedance is made to match that of the active circuit 50 by adjusting the gap 2(*d*) appropriately. 50 ohms is the nominal value used in the industry although any other impedance may be employed. In the illustrated embodiment 32 cards, comprising 64 slotline elements, are shown, but more or less elements may be included depending upon the desired output power. The coaxial line flare of section 16 and 18 has also been optimized to match the standard 50 ohm value to a 30 ohm impedance of center coaxial section 20, which holds cards 34.

The tapered slot structure is inherently broad band and provides excellent input/output isolation. In turn the coaxial environment supports a TEM mode which has no low frequency cutoff. Theses features guarantee broadband performance. The radial configuration of tapered slotline transitions 34 in the present invention allows for high device packing density. The inner and outer radius of flared coaxial line 16 and 18 can be chosen to accommodate as many devices as may be needed to meet a specific power demand.

Slotline 34 as shown in FIG. 3 illustrates a single card that incorporates two slotline array elements, namely a lower and upper slotline transition 46. The concept can be extended to include more slotline elements on a single card in a straightforward manner if desired. A transition from a slotline 34 to a microstrip or coplanar waveguide (CPW) can be employed to incorporate microstrip or CPW base active circuits on cards 34. This approach is amenable to both model fabrication or hybrid design for slotline card 34. It is also compatible to commercially available amplifier chips. For example, turning to FIG. 4, slotline card 34 of FIG. 3 is shown as having two microwave integrated circuit amplifiers 50, coupled between metalizations 42 and 44. In this way, amplification of the microwave signal by an external source of power (not shown) can be easily achieved. Passive circuits may also be used.

This technique addresses a key problem with solid state devices, which is a limited power-handling capability. By distributing the total input power over a multiplicity of devices, such as N devices, an amplifier module can be provided which can handle N times the amount of power that a single device can. Power incident from coaxial line 12 or 14 is distributed spatially over a large number of active elements in an efficient manner. The output power of the individual devices, 50, is similarly combined in an efficient manner. This power-combining module is compact and can be made to cover any frequency ban with the appropriate choice of taper for slotline 34 and flare sections 16 and 18 for the coaxial line.

The transmission and reflection properties of flared coaxial lines 16 and 18 were tested both with and without slotline insertion cards in them in FIGS. 5 and 6, respectively. As stated, the flare has been optimized to reduce return loss by matching 50 ohm input to the large radius 30 ohm central coaxial segment over a broad band. The first higher order mode appears at 15 GHz as shown in FIG. 5. FIG. 5 is a graph with a relative power in dB versus the frequency in GHz for a combiner of invention without any slotline card 34 inserted into it. FIG. 6 is the same graph with 32 cards having an optimized taper, but without any devices mounted thereon. S11 is the reflection coefficient shown in dotted line 52 and S21 the transmission coefficient shown in solid line 54 of combiner 10. The relative power transmission through combiner 10, 10 log $(|S11|^2+|S21|^2)$, is shown by the diamond shaped data points 56 as very near 0 dB. Broadband transmission is observed at FIG. 6 from 8–20 GHz. The insertion loss is on the order of 1.5 dB with a 1 dB ripple over the band. Higher order modes are suppressed by the presence of slotline array 34. Therefore, what has been provided is a combiner that preserves low insertion loss over a broad band with a large number of power combining elements. This is to be contrasted from conventional Wilkinson-based combiners which incur unacceptable losses for this number of elements in this bandwidth.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. In microwave power combiner comprising:

a conical coaxial first section;

a conical coaxial second section;

a center cylindrical coaxial section coupled between said first and second conical coaxial sections;

a plurality of tapered slotline cards disposed in said center cylindrical coaxial section between an inner and outer conductor thereof and electromagnetically coupled to said first and second conical coaxial sections, each slotline card having a plurality of slotline transmission lines lying on a radial plane defined through said center cylindrical coaxial section;

a corresponding plurality of devices disposed on each of said plurality of tapered slotline cards, one of said devices coupled to each of said slotline transmission lines, wherein power coupled to a first one of said first and second conical sections is efficiently distributed among said plurality of devices and then efficiently recombined in a second one first and second conical sections so that a compact array with an increased number of said devices is provided in said combiner.

2. The combiner of claim 1 wherein signal communication through said combiner is bidirectional, being either received by said first conical section and output through said second conical section and vice versa.

3. The combiner of claim 1 wherein said plurality of devices comprise amplifiers for amplifying a received input signal on one of said first and second conical sections and outputting said amplified signal on a second one of said first and second conical sections.

4. The combiner of claim 3 wherein signal communication through said combiner is bidirectional, being either received by said first conical section and output through said second conical section and vice versa.

5. The combiner of claim 1 wherein each of said plurality of taper slotline cards is positioned radially within said center cylindrical coaxial section at approximately 11.25° increments.

6. The combiner of claim 1 wherein at least 32 of said tapered slotline cards are disposed in said center cylindrical coaxial section.

7. The combiner of claim 1 wherein each of said tapered slotline cards is provided with a tapered slot structure which is arranged and configured to optimize impedance matching between said center cylindrical coaxial section and said first and second conical coaxial sections.

8. The combiner of claim 1 wherein said plurality of slotline cards are provided in said combiner in a number dependent upon power output demanded for said combiner.

9. The combiner of claim 1 further comprising a coaxial terminal coupled to each of the said first and second conical coaxial sections.

10. The combiner of claim 1 wherein each of said tapered slotline cards are arranged and configured to provide a gradual transition from a coaxial transmission line within said first and second conical sections to a planar transmission line within said tapered slotline card.

11. The combiner of claim 1 wherein at least one of said plurality of devices is a passive circuit.

12. The combiner of claim 1 wherein at least one of said plurality of devices is an active circuit.

13. The combiner of claim 1 wherein said tapered slotline card comprises at least one tapered slot structure disposed on said card, arranged and configured to minimize reflection between said center cylindrical coaxial section and said first and second conical coaxial sections.

14. A method of efficiently combining high-powered electromagnetic signals comprising:

providing an input electromagnetic signal to a first flared coaxial section;

distributing said electromagnetic signal in said first flared coaxial section to and in a center cylindrical coaxial section, said electromagnetic signal being coupled to and distributed among a plurality of radially oriented tapered slotline structures disposed between an inner conductor of said cylindrical coaxial section and an outer conductor of said cylindrical coaxial section, a subplurality of said plurality of slotline structures lying in each of a plurality of radial planes defined through said center cylindrical coaxial section;

operating on said electromagnetic signal in each of said slotline structures within a corresponding device;

combining said electromagnetic signal output by said device from each of said slotline structures into a second flared coaxial section, wherein high-powered electromagnetic signals are operated upon by plurality of lower powered devices in a compact assembly to result in a efficient and broadband operation.

15. The method of claim 14 wherein distributing said electromagnetic signal from said first flared coaxial section to said cylindrical coaxial section and from cylindrical coaxial section to said second flared coaxial section comprises minimizing reflection of said electromagnetic signal between said first flared coaxial section and said cylindrical coaxial section and between said cylindrical coaxial section and said second flared coaxial section.

16. The method of claim 14 where coupling said electromagnetic signal between said first flared coaxial section and said cylindrical coaxial section between said cylindrical coaxial section and said second flared coaxial section comprises matching impedance between therebetween.

17. The method of claim 14 where operating on said electromagnetic signal with said devices comprises amplifying said electromagnetic signal in said devices.

* * * * *